United States Patent
Van Der Zwan et al.

(10) Patent No.: US 6,584,157 B1
(45) Date of Patent: Jun. 24, 2003

(54) RECEIVER HAVING INTEGRATED MIXER AND SIGMA-DELTA ANALOG-TO DIGITAL CONVERSION

(75) Inventors: Eric J. Van Der Zwan, Eindhoven (NL); Eise C. Dijkmans, Eindhoven (NL); William Donaldson, Redhill (GB); Anthony D. Sayers, Furnace Geern (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/342,827

(22) Filed: Jun. 29, 1999

(65) Prior Publication Data (65)

(30) Foreign Application Priority Data

Jun. 30, 1998 (EP) .............................. 98305157

(51) Int. Cl.[7] ................................. H04B 14/06
(52) U.S. Cl. ................... 375/247; 375/316; 341/143
(58) Field of Search ................. 375/247, 248, 375/249, 250, 350, 252, 316, 339; 341/77, 139, 110, 126, 143, 144, 152, 157, 155; 455/131, 140, 141, 323, 324, 293, 291, 189.1, 190.1, 209, 231, 234.1; 327/3, 16, 40, 54, 63, 74, 87, 113; 329/302, 323

(56) References Cited

U.S. PATENT DOCUMENTS

| | | | | |
|---|---|---|---|---|
| 5,039,989 A | * | 8/1991 | Welland et al. | 341/143 |
| 5,345,188 A | * | 9/1994 | Owen | 329/323 |
| 5,448,202 A | * | 9/1995 | Owen | 329/323 |
| 5,608,400 A | * | 3/1997 | Pellon | 341/143 |
| 5,673,044 A | * | 9/1997 | Pellon | 341/143 |
| 5,867,054 A | * | 2/1999 | Kotowski | 327/513 |
| 5,959,562 A | | 9/1999 | Wiesbauer | 341/143 |
| 6,005,500 A | * | 12/1999 | Gaboury et al. | 341/143 |
| 6,040,793 A | * | 3/2000 | Ferguson et al. | 341/143 |
| 6,064,871 A | * | 5/2000 | Leung | 455/323 |
| 6,111,531 A | * | 8/2000 | Farag | 341/143 |
| 6,148,048 A | * | 11/2000 | Kerth et al. | 375/350 |
| 6,160,506 A | * | 12/2000 | Pellon | 341/143 |
| 6,175,728 B1 | * | 1/2001 | Mitama | 455/323 |
| 6,218,972 B1 | * | 4/2001 | Groshong | 341/143 |

OTHER PUBLICATIONS

E.J. van der Zwan et al, "A 0.2–mW CMOS Sigma–Delta Modulator for Speech Coding with 80 dB Dynamic Range", IEEE Journal of Solid–State Circuits, vol. 31, No. 12, Dec. 1996.

* cited by examiner

*Primary Examiner*—Emmanuel Bayard
(74) *Attorney, Agent, or Firm*—John Vodopia

(57) ABSTRACT

A receiver with an integrated mixer/Sigma-Delta Modulator configuration for digitizing a relatively low-bandwidth signal modulated on a high-frequency carrier, for example in a radio receiver. The Sigma-Delta Modulator has an continuous-time loop filter (F1, F2) with anti-aliasing characteristics which eliminate the need for a separate lowpass filter between the mixer (MX) and the Sigma-Delta Modulator.

7 Claims, 5 Drawing Sheets

RECEIVER HAVING INTEGRATED MIXER AND SIGMA-DELTA ANALOG-TO DIGITAL CONVERSION

BACKGROUND OF THE INVENTION

1. Field of the Invention

The invention relates to a receiver comprising: a mixer for mixing an oscillator signal with a carrier signal modulated by an information signal, and an analog-to-digital converter for converting the information signal to a digital signal.

2. Description of Related Art

FIG. 1 shows a block diagram of a conventional superheterodyne receiver. By way of example a receiver for a GSM (Global System for Mobile communication) telephone is shown. However, similar techniques are used in, for example paging or radio receivers. The radio frequency (RF) signal is first mixed to an intermediate frequency (IF) using a first local oscillator signal LO1. After that the information signals I and Q are separately mixed down to baseband signals using two mixers MX2A and MX2B and second local oscillator signals LO2A and LO2B which have a phase difference of 90 degrees. After passing an anti-aliasing lowpass filter LPF the information signals are converted to the digital domain by means of analog-to-digital (A/D) converters. In this conventional receiver the mixing-down to baseband signal and the conversion of the baseband signal to a digital signal requires a mixer, a lowpass filter and an A/D converter. Such a solution has a drawback that it is costly because of the relatively expensive passive filter used in the superheterodyne receivers.

It is an object of the invention to mitigate the drawbacks of the conventional receiver. To this end the receiver as specified in the opening paragraph is characterised in that the analog-to-digital converter is a sigma-delta converter comprising: an input stage for coupling the information signal to an input of a continuous-time loopfilter, a quantizer for quantizing an output signal of the loopfilter and for generating the digital signal, and a digital-to-analog converter for feeding back the digital signal to the input of the loopfilter, the input stage comprising the mixer and having a first input for receiving the carrier signal, a second input for receiving the oscillator signal and an output coupled to the input of the loopfilter for providing the information signal to the loopfilter.

The approach according to the invention uses a mixer and a Sigma-Delta Modulator for A/D conversion without anti-aliasing lowpass filter. The output of the mixer is directly supplied to the loop filter of the Sigma-Delta Modulator. The use of a Sigma-Delta Modulator for converting an analog signal to a digital signal is known from, for example, an article by E. J. van der Zwan and E. C. Dijkmans: "A 0.2-mW CMOS Sigma-Delta Modulator for Speech Coding with 80 dB Dynamic Range", IEEE Journal of Solid-State Circuits, Vol. 31, No. 12, December 1996. The principle of operation of the Sigma-Delta Modulator, as described in the referenced article, is that the information signal is fed to a feedback loop comprising a continuous-time analog filter, a sampler and a digital-to-analog converter (DAC). The output signal of the Sigma-Delta Modulator is a stream of bits at a highly oversampled rate. The oversampled bitstream is fed to subsequent digital processing which converts the bitstream to an accurate digitised representation of the information signal in a process known as decimation. The continuous-time analog loop filter used in the Sigma-Delta Modulator of the referenced article has good anti-aliasing characteristics. Therefore by employing the Sigma-Delta Modulator as an A/D converter in the aforementioned receiver, the lowpass filter between the mixer and the A/D converter can be omitted. This can lead to simple mixer/Sigma-Delta Modulator structures with less components, chip area and power consumption. Preferred and advantageous embodiments are defined in the dependent claims.

OBJECTS AND SUMMARY OF THE INVENTION

The above and other features and advantages of the invention will be apparent from the following description of exemplary embodiments of the invention with reference to the accompanying drawings, in which:

BRIEF DESCRIPTION OF THE DRAWINGS

In the FIGURES corresponding or similar features are denoted by the same reference symbols.

DETAILED DESCRIPTION OF THE PREFERRED EMBODIMENTS

Figure 1:
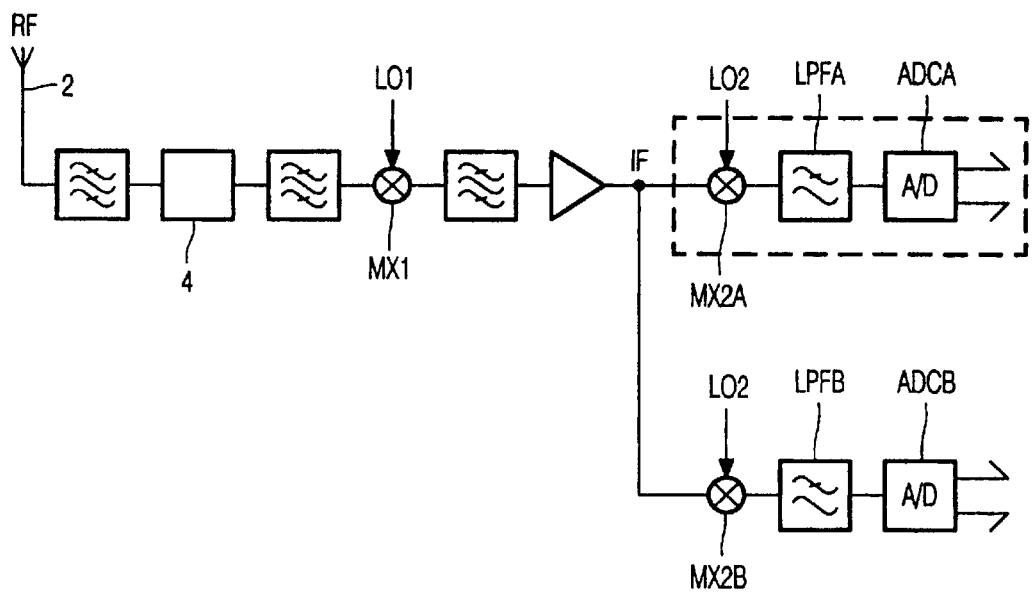
FIG. 1 is a block diagram of a conventional superheterodyne GSM receiver.

FIG. 1 shows a block diagram of a conventional superheterodyne receiver. By way of example a receiver for a GSM (Global System for Mobile communication) telephone is shown. However, similar techniques are used in, for example paging receivers. The radio frequency (RF) signal received by antenna 2 and filtered and amplified by an amplifier 4 is first mixed down in a mixer MX1 to an intermediate frequency (IF) using a first local oscillator signal LO1. After that the intermediate frequency signals are separately mixed down to baseband I and Q information signals using two mixers MX2A and MX2B and second local oscillator signals LO2A and LO2B which have a phase difference of 90 degrees. After passing an anti-aliasing lowpass filter LPFA, LPFB the information signals are converted to the digital domain by means of analog-to-digital (A/D) converters ADCA, ADCB. In this conventional receiver the mixing-down to baseband signal and the conversion of the baseband signal to a digital signal requires a mixer, a lowpass filter and an A/D converter for each of the signals I and Q. For GSM the bandwidth of the information signals I and Q is relatively low: about 100 kHz, which results in a channel width of about 200 kHz. The RF frequency is about 900 MHz and the IF frequency is about 50 to 150 MHz. So, the bandwidth of the information signal is relatively low in respect of the IF carrier frequency.

From the afore-mentioned article it is known that a Sigma-Delta Modulator with a continuous-time loop filter has good anti-aliasing characteristics. By integrating the mixer and a Sigma-Delta Modulator according to the principles of the referenced article it is possible to omit the low-pass filter LPFA/LPFB. This can lead to simple structures to perform the functions indicated within the dashed lines in FIG. 1.

Figure 2:
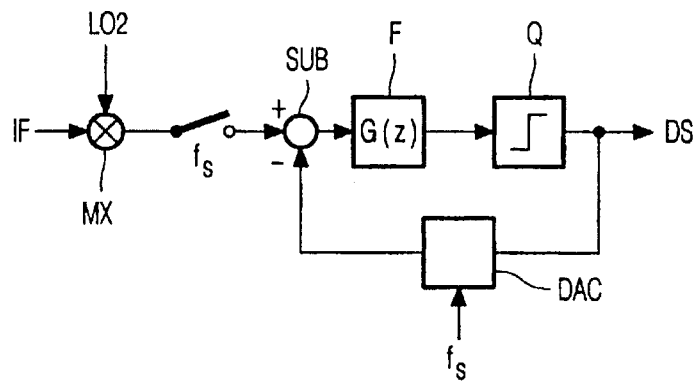
FIG. 2 shows a mixer followed by a discrete-time Sigma-Delta Modulator.
Figure 3:
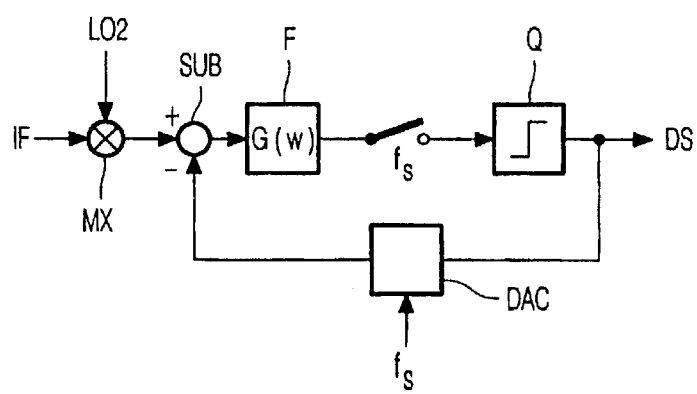
FIG. 3 shows a mixer followed by a Sigma-Delta Modulator with continuous-time loop filter.

Consider a mixer MX followed by a Sigma-Delta Modulator, which may be a discrete-time implementation as shown in FIG. 2, or which may have a continuous-time loop filter as shown in FIG. 3. In the structure of FIG. 2 the sampling is performed at the mixer output, while in the structure of FIG. 3 the sampling takes place at the back-end of the loop filter, which is a lowpass filter in this case. The Sigma-Delta Modulator consists of a subtracter SUB, a loop filter F, followed by a quantizer Q, and a digital-to-analog converter DAC for feeding the digital data signal DS of the quantizer Q back to the subtracter SUB.

Figure 4:
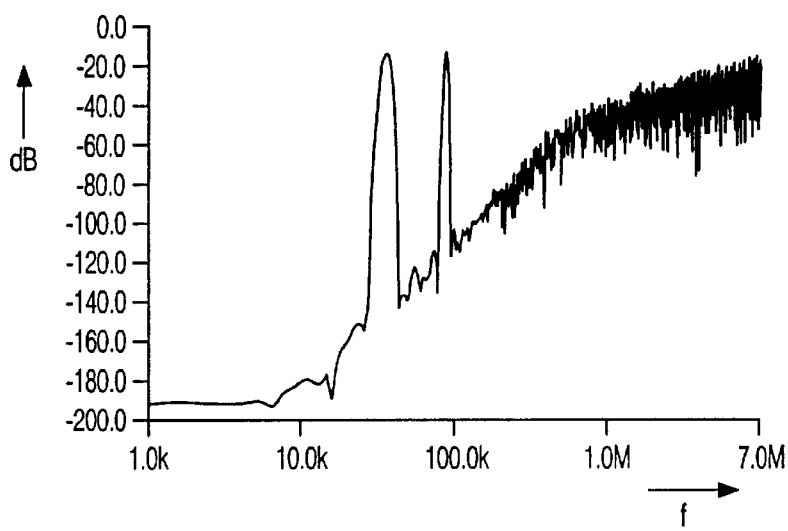
FIG. 4 shows the output spectrum of a linear mixer followed by a discrete-time Sigma-Delta Modulator.
Figure 5:
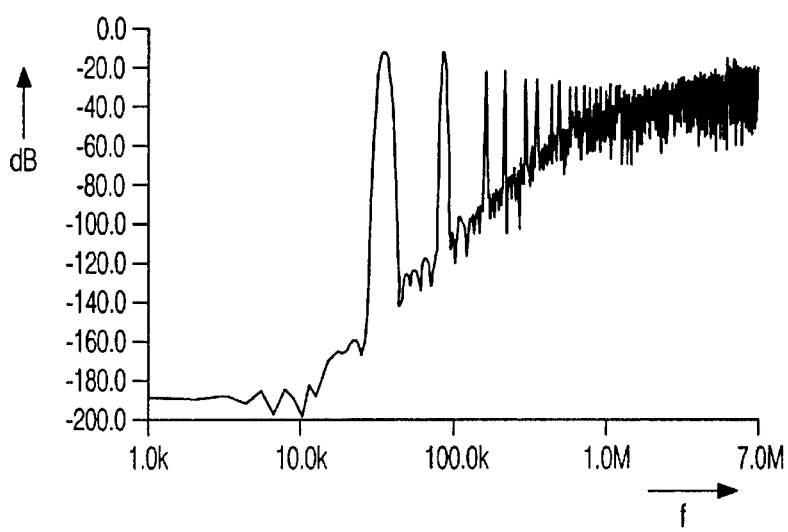
FIG. 5 shows the output spectrum of a square-wave mixer followed by a discrete-time Sigma-Delta Modulator.

The structure of FIG. 2, i.e. a mixer followed by a sampler, leads to aliasing problems if the local oscillator frequency LO2 is not an integer multiple of the sampling frequency $f_S$. Suppose that the input signal IF has a frequency $f_{in}$=51.22 MHz, which is linearly mixed down with a local oscillator frequency $f_{LO2}$=51.25 MHz, and that the sampling frequency $f_S$=12.8 MHz. The bandwidth of interest is plus and minus 100 kHz. The mixer output contains a wanted $f_{LO2}-f_{in}$=30 kHz component, but also a $f_{LO2}+f_{in}$=102.47 MHz component. If this 102.47 MHz component is sampled at $f_S$=12.8 MHz, then an unwanted in-band component at $f_{LO2}+f_{in}-8f_S$=70 kHz results. This is illustrated in FIG. 4 which shows the spectrum of the digital data output signal DS of the structure of FIG. 2 using a $4^{th}$ order Sigma-Delta Modulator. The situation gets even worse if the mixing is performed with a 51.25 MHz square wave, which is easier to implement than a sinusoidal wave. In that case also higher harmonics of the square wave have to be taken into account and the resulting spectrum is shown in FIG. 5. For example, the third harmonic of the oscillator frequency $f_{LO2}$ causes a component at $3f_{LO2}-f_{in}$=102.53 MHz. Sampling this component at the sampling frequency $f_S$=12.8 MHz gives an unwanted in-band component at $3f_{LO2}-f_{in}-8f_S$=130 kHz.

Figure 6:
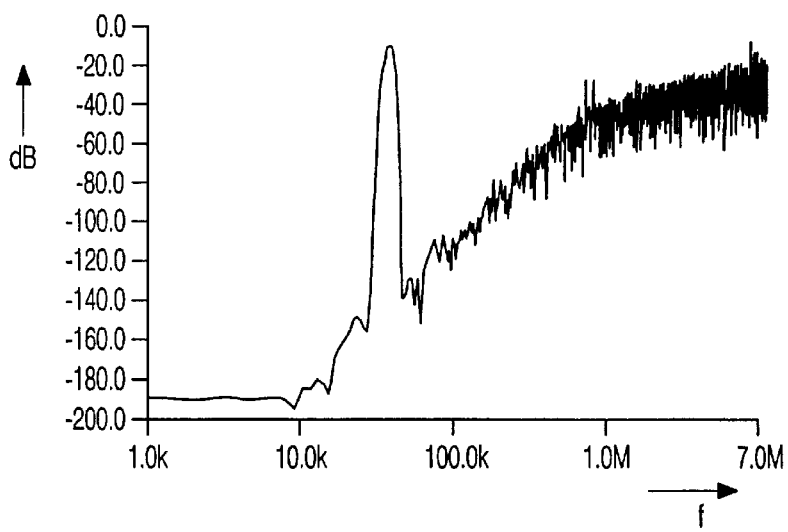
FIG. 6 shows the output spectrum of a square-wave mixer followed by a Sigma-Delta Modulator with continuous-time loop filter.

However, these problems are prevented in the structure of FIG. 3 which uses a Sigma-Delta Modulator with continuous-time loop filter. FIG. 6 shows the spectrum of the digital data output signal DS under the same conditions as the example of FIG. 5, i.e. the input signal IF is mixed with a square wave oscillator signal LO2 and then fed to the input of a $4^{th}$ order Sigma-Delta Modulator. The performance is better because no unwanted frequency components appear in the spectrum of the digital data output signal DS. This means that the sampling frequency $f_S$ can be chosen independently of the local oscillator frequency $f_{LO2}$ without causing aliasing problems.

Figure 7:
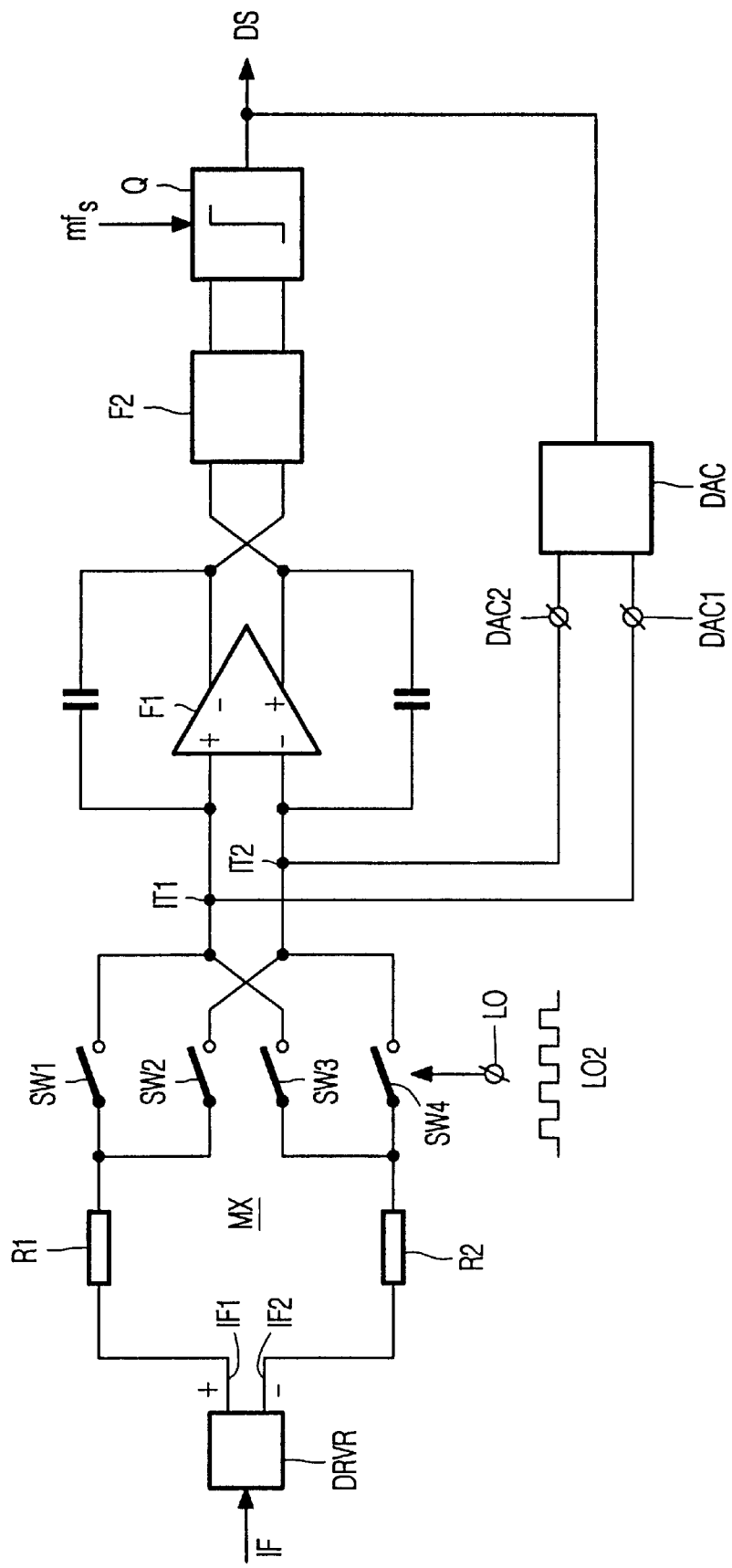
FIG. 7 shows a circuit diagram of a first implementation of an integrated mixer/Sigma-Delta Modulator for use in a receiver made in accordance with the present invention.

FIG. 7 shows a first implementation of the structure of FIG. 3. The Sigma-Delta Modulator has basically the same structure as the Sigma-Delta Modulator known from the afore-mentioned article. Only the first integrator F1 of the loop filter is shown in detail. The rest of the loop filter F2 may consist of more integrators and coefficients, and thus the loop filter may be of any order and/or structure. The first integrator F1 has balanced inputs and outputs and has a non-inverting input connected to a first input terminal IT1 of the loop filter and an inverting input connected to a second input terminal IT2 of the loop filter. The digital-to-analog converter DAC has balanced outputs DAC1 and DAC2 connected to the input terminals IT1 and IT2, respectively. The mixer is implemented as a set of switches SW1, SW2, SW3, and SW4. Switch SW1 connects a resistor R1 to input terminal IT1 and switch SW4 connects a resistor R2 to input terminal IT2 during the first half period of the square wave oscillator signal LO2, which is available at an input terminal LO. Switch SW2 connects the resistor R1 to input terminal IT2 and switch SW3 connects the resistor R2 to input terminal IT1 during the second half period of the square wave oscillator signal LO2. The resistors R1 and R2 are fed by balanced IF carrier signals from outputs IF1 and IF2 of a driver DRVR. The balanced IF carrier signals are converted into balanced currents by the resistors R1 and R2. These balanced currents are connected straight or cross-coupled to the input terminals IT1 and IT2 by the switches SW1 to SW4 and integrated in integrator F1.

Figure 8:
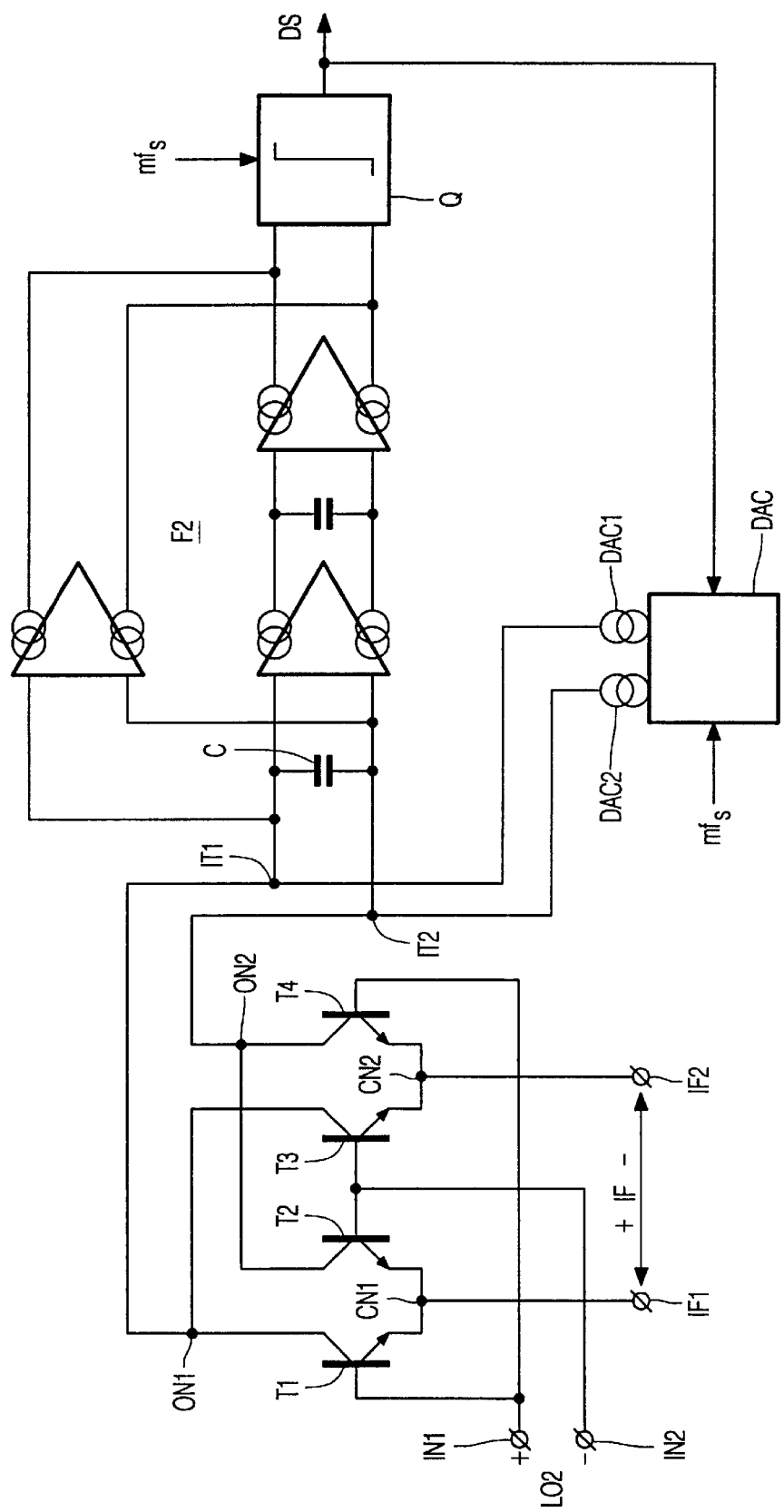
FIG. 8 shows a circuit diagram of a second implementation of an integrated mixer/Sigma-Delta Modulator for use in a receiver made in accordance with the present invention.

FIG. 8 shows an alternative implementation of the structure of FIG. 3. The mixer is implemented with a NPN four-transistor structure T1, T2, T3, T4, which is known per se and often referred to as the Gilbert cell mixer. Transistors T1 and T2 form a first differential pair and have their emitters connected in a first common node CN1. Transistors T3 and T4 form a second differential pair with a second common node CN2. The balanced IF carrier signal at nodes IF1 and IF2 is fed to the common nodes CN1 and CN2. The local oscillator signal LO2 is fed to a pair of input nodes IN1 and IN2. The bases of the transistors T1 and T4 are coupled to input node IN1 and the bases of the transistors T2 and T3 are coupled to the input node IN2. The collectors of the transistors T1 and T3 are both connected to an output node ON1, which in turn is connected to the input terminal IT1 of the loop filter of the Sigma-Delta Modulator. The collectors of the other two transistors T2 and T4 are both connected to an output node ON2, which in turn is connected to the input terminal IT2. The structure of the transistors T1 to T4 has the same effect as the switches SW1 to SW4 in FIG. 7. The switched balanced output currents flowing out of output nodes ON1 and ON2 are integrated by means of a capacitor C connected between the output nodes ON1 and ON2. The switching transistors T1 to T4 not only perform the mixing function, but also function as the input transconductor of the Sigma-Delta Modulator. This decreases the power consumption of the combination and reduces component count. If two such structures are manufactured on a single chip, as is the case in the GSM receiver shown in FIG. 1, matching between the two I and Q processing channels is very good.

Figure 9:
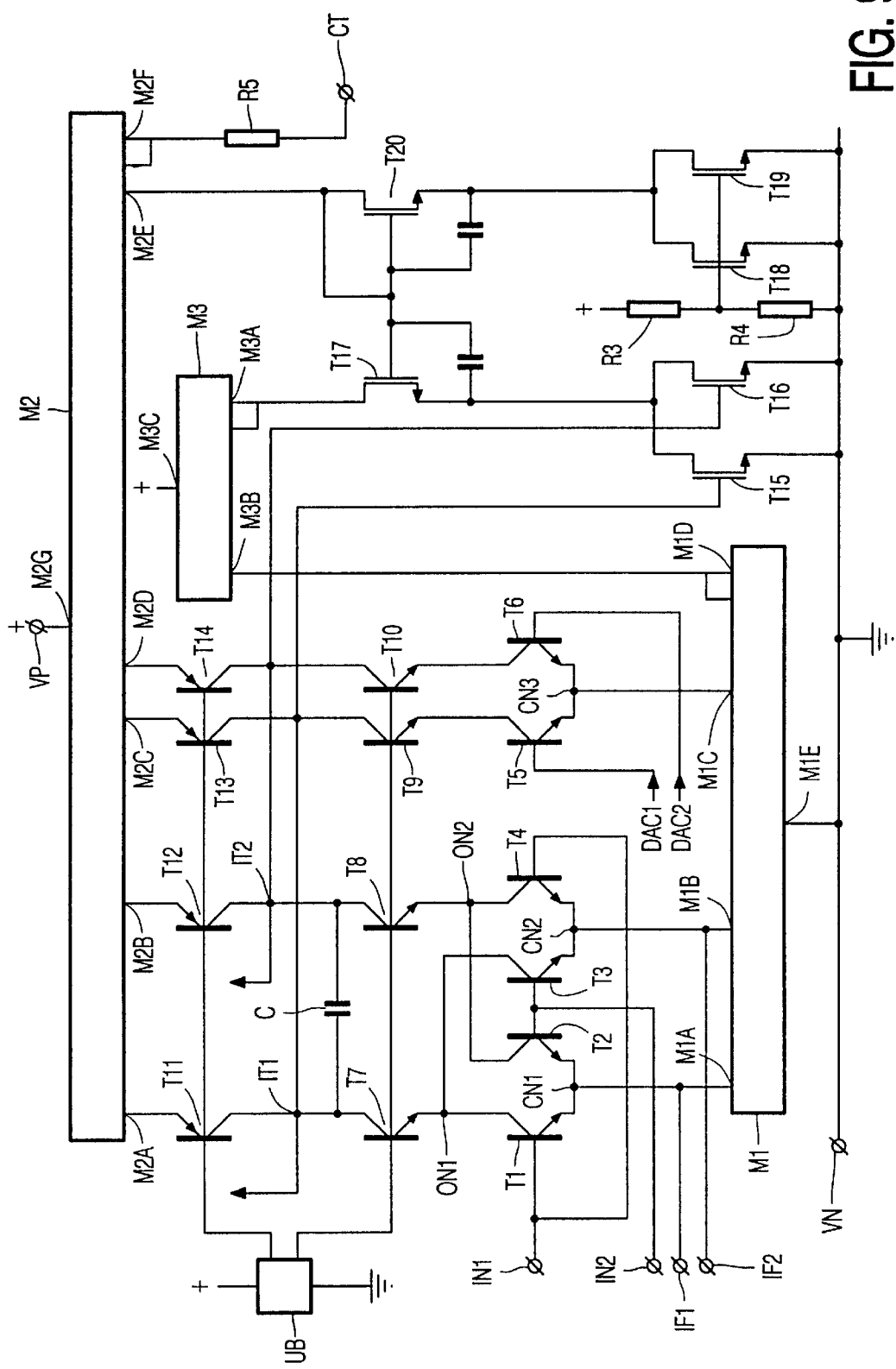
FIG. 9 shows detailed transistor circuits of the second implementation of FIG. 8.

FIG. 9 shows a more detailed circuit diagram of the mixing input stage of the implementation of FIG. 8. The common nodes CN1 and CN2 receive bias currents from respective output branches M1A and M1B of a current mirror M1, which has its common terminal M1E connected to a negative supply terminal VN. The balanced outputs DAC1 and DAC2 drive a further NPN differential pair consisting of transistors T5 and T6. The common node CN3 of this transistor pair receives a bias current from an output branch M1C of the current mirror M1. NPN cascode transistors T7 and T8 are inserted in series with output node ON1 and output node ON2, respectively, to provide a high output impedance level at the input terminals IT1 and IT2. The collector of transistor T5 is connected to the input terminal IT1 through a NPN cascode transistor T9 and the collector of transistor T6 connected to the input terminal IT2 through a NPN cascode transistor T10, again to provide a high impedance level at the input terminals IT1 and IT2. The high impedance level makes possible a large integrating time constant with a low capacitance value of the integrating capacitor C. The collectors of the NPN cascode transistors T7 to T10 are all actively loaded by means of current source transistors incorporated in respective output branches M2A, M2B, M2C and M2D, respectively, of a second current mirror M2 which has its common terminal M2G connected to a positive supply terminal VP. The output branches M2A, M2B, M2C and M2D are each cascoded by means of PNP cascode transistors T11, T12, T13 and T14, respectively to increase the output impedance of the current source transistors incorporated in the output branches M2A to M2D of current mirror M2. The bases of the NPN cascode transistors T7 to T10 and bases of the PNP cascode transistors T11 to T14 receive suitable bias voltages from a bias voltage generator UB.

The input terminals IT1 and IT2 are further connected to the gates of two NMOS transistors T15 and T16 which sense the DC voltage at the input terminals IT1 and IT2. The sources of the transistors T15 and T16 are connected to the negative supply terminal VN. The drains of the transistors T15 and T16 are both coupled to an input branch M3A of a third current mirror M3 through the channel of a NMOS transistor T17. The third current mirror M3 has an output branch M3B connected to an input branch M1D of the first current mirror M1, and has its common terminal M3C connected to the positive supply terminal VP. NMOS transistors T18 and T19 are copies of the NMOS transistors T15 and T16. The gates of the transistors T18 and T19 are both connected to a tapping of a voltage divider consisting of resistors R3 and R4 which are series connected between the positive supply terminal VP and the negative supply terminal VN. The sources of the transistors T18 and T19 are connected to the negative supply terminal VN, while the drains of these transistors are both coupled to an output branch M2E of the second current mirror M2 through a diode connected NMOS transistor T20, which is a copy of NMOS transistor T17 and which has its gate connected to the gate of the transistor T17. The second current mirror M2 has an input branch M2F which is coupled to a control terminal CT through a resistor R5.

The DC levels at terminals IT1 and IT2 are sensed by the transistors T15 and T 16 and kept at a level dictated by the voltage at the tapping of the voltage divider R3–R4. The value of the bias currents can be adjusted by means of a control current at the control terminal CT. Using MOS transistors as sense transistors has the advantage that no DC current can flow from the terminals IT1 and IT2 to the sense transistors.

The embodiments of the present invention described herein are intended to be taken in an illustrative and not a limiting sense. Various modifications may be made to these embodiments by persons skilled in the art without departing from the scope of the present invention as defined in the appended claims.

What is claimed is:

1. A receiver comprising:
   a mixer (MX) for mixing an oscillator signal (LO2) with a carrier signal (IF) modulated by an information signal, and
   an analog-to-digital converter for converting the information signal to a digital signal (DS), wherein the analog-to-digital converter is a Sigma-Delta Modulator comprising:
   an input stage (DRVR, MX) for coupling the information signal to an input (IT1, IT2) of a continuous-time loop filter (F1, F2),
   a quantizer (Q) for quantizing an output signal of the loop filter (F1, F2) and for generating the digital signal (DS), and
   a digital-to-analog converter (DAC) for feeding back the digital signal (DS) to the input (IT1, IT2) of the continuous-time loop filter (F1, F2), the input stage comprising the mixer (MX) and having a first input (IF) for receiving the carrier signal, a second input (LO) for receiving the oscillator signal (LO2) and an output coupled to the input (IT1, IT2) of the continuous-time loop filter (F1, F2) for providing the information signal to the continuous-time loop filter (F1, F2),
   wherein the continuous-time loop filter comprises a balanced integrator (F1) having an inverting and a non-inverting input terminal connected to respective terminals (IT1, IT2) of the input of the continuous-time loop filter, and wherein the input stage comprises means (DRVR) for converting the carrier signal to a balanced carrier signal and means (SW1, SW2, SW3, SW4) for alternately coupling and cross-coupling the balanced carrier signal to the respective terminals (IT1, IT2) of the input of the continuous-time loop filter in response to the oscillator signal (LO2).

2. A receiver as claimed in claim 1, wherein the means for alternately coupling and cross-coupling comprises:
   first (T1, T2) and second (T3, T4) differential transistor pairs having their common nodes (CN1, CN2) connected to receive a balanced carrier signal (IF1, IF2), having corresponding input nodes connected to receive the balanced oscillator signal in opposite phase and having corresponding output nodes (ON1, ON2) coupled to the respective terminals (IT1, IT2) of the input of the continuous-time loop filter through respective cascade transistors (T7, T8).

3. A receiver as claimed in claim 2, further comprising:
   a first current mirror (M1) having respective output branches (M1A, M1B) coupled to the common nodes (CN1, CN2) for supplying bias currents to said common nodes (CN1, CN2), a second current mirror (M2) having respective output branches (M2A, M2B) coupled to said respective terminals (IT1, IT2) through respective cascade transistors (T11, T12) for supplying bias currents to the means (T1, T2, T3, T4) for alternately coupling and cross-coupling via said respective terminals (IT1, IT2), means (T15, T16) for sensing a voltage at said respective terminals (IT1, IT2) and means (T17, M3, M1; R3, R4, T18, T19, T20, M2), responsive to the means for sensing, for controlling the bias currents supplied by the respective output branches of the first and second current mirrors (M1, M2).

4. A receiver as claimed in claim 3, further comprising:
   a further differential transistor pair (T5, T6) having a common node (CN3) coupled to a further output branch (M1C) of the first current mirror (M1), having input nodes connected to receive a balanced output signal (DAC1, DAC2) from the digital-to-analog converter (DAC) and having output nodes coupled to said respective terminals (IT1, IT2) through respective cascade transistors (T9, T10).

5. A receiver as claimed in claim 4, wherein the second current mirror comprises further output branches (M2C, M2D) coupled to said respective terminals (IT1, IT2) through respective further cascade transistors (T13, T14).

6. A receiver as claimed in claim 5, wherein the means for sensing comprise MOS transistors (T15, T16) having respective gates connected to said respective terminals (IT1, IT2).

7. A receiver as claimed in claim 6, further comprising:
a third current mirror (M3) having an output branch (M3B) coupled to an input branch (M1D) of the first current mirror (M1) and having an input branch (M3A) coupled to drains of the MOS transistors (T15, T16) through a further MOS transistor (T17), the further MOS transistor having a gate electrode connected to a gate electrode of a second further diode connected MOS transistor (T20) for coupling a further output branch (M2E) of the second current mirror (M2) to a drain of a third further MOS transistor (T18) having a gate electrode connected to receive a fixed bias voltage (R3, R4).

* * * * *